(12) United States Patent
Cho et al.

(10) Patent No.: US 9,299,690 B2
(45) Date of Patent: Mar. 29, 2016

(54) METHOD FOR FABRICATING A POWER SEMICONDUCTOR PACKAGE INCLUDING VERTICALLY STACKED DRIVER IC

(71) Applicant: Infineon Technologies Americas Corp., El Segundo, CA (US)

(72) Inventors: Eung San Cho, Torrance, CA (US); Andrew N. Sawle, East Grinstead (GB); Mark Pavier, Felbridge (GB); Daniel Cutler, Betchworth (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/876,631

(22) Filed: Oct. 6, 2015

(65) Prior Publication Data

US 2016/0027767 A1 Jan. 28, 2016

Related U.S. Application Data

(62) Division of application No. 14/023,038, filed on Sep. 10, 2013, now Pat. No. 9,159,703.

(60) Provisional application No. 61/715,749, filed on Oct. 18, 2012.

(51) Int. Cl.
*H01L 29/78* (2006.01)
*H01L 25/00* (2006.01)
*H01L 25/16* (2006.01)
*H01L 23/00* (2006.01)

(52) U.S. Cl.
CPC ............... *H01L 25/50* (2013.01); *H01L 24/85* (2013.01); *H01L 25/16* (2013.01); *H01L 2924/1306* (2013.01); *H01L 2924/1426* (2013.01)

(58) Field of Classification Search
CPC ............... H01L 2924/01079; H01L 2924/14; H01L 2924/01029; H01L 2924/01078; H01L 2924/15311
USPC .................................................. 435/107–108
See application file for complete search history.

*Primary Examiner* — Monica D Harrison
(74) *Attorney, Agent, or Firm* — Farjami & Farjami LLP (57) ABSTRACT

In one implementation, a semiconductor package includes a control conductive carrier having a die side and an opposite input/output (I/O) side connecting the semiconductor package to a mounting surface. The semiconductor package also includes a control FET of a power converter switching stage attached to the die side of the control conductive carrier, and a driver integrated circuit (IC) for driving the control FET. The driver IC is situated above the control FET and is electrically coupled to the control FET by at least one conductive buildup layer formed over the control conductive carrier.

11 Claims, 8 Drawing Sheets

METHOD FOR FABRICATING A POWER SEMICONDUCTOR PACKAGE INCLUDING VERTICALLY STACKED DRIVER IC

This is a divisional of application Ser. No. 14/023,038 filed Sep. 10, 2013, which itself claims benefit of and priority to U.S. Provisional Patent Application Ser. No. 61/715,749, filed Oct. 18, 2012. The disclosures in the above-identified patent applications are hereby incorporated fully by reference into the present application.

BACKGROUND

Background Art

Power converters are used in a variety of electronic circuits and systems. Many integrated circuit (IC) applications, for instance, require conversion of a direct current (DC) input to a lower, or higher, DC output. For example, a synchronous buck converter may be implemented as a voltage regulator to convert a higher voltage DC input to a lower voltage DC output for use in low voltage applications in which relatively large output currents are required.

The voltage converted output of a synchronous buck converter is typically provided by a power switching stage including a high side control switch and a low side synchronous (sync) switch, which may be driven by a driver IC of the buck converter. Drive signals from the driver IC may be routed to the power switching stage through a printed circuit board (PCB) or package substrate. Consequently, packaging solutions for such power converters must typically be sized to accommodate a side-by-side layout including not only the control and sync switches of the power converter switching stage, but the driver IC for those power switches as well.

SUMMARY

The present disclosure is directed to a power converter package including a vertically stacked driver integrated circuit (IC), substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, power converters such as voltage regulators are used in a variety of electronic circuits and systems. For instance, and as noted above, integrated circuit (IC) applications may require conversion of a direct current (DC) input to a lower, or higher, DC output. As a specific example, a buck converter may be implemented as a voltage regulator to convert a higher voltage DC input to a lower voltage DC output for use in low voltage applications in which relatively large output currents are required.

Figure 1:
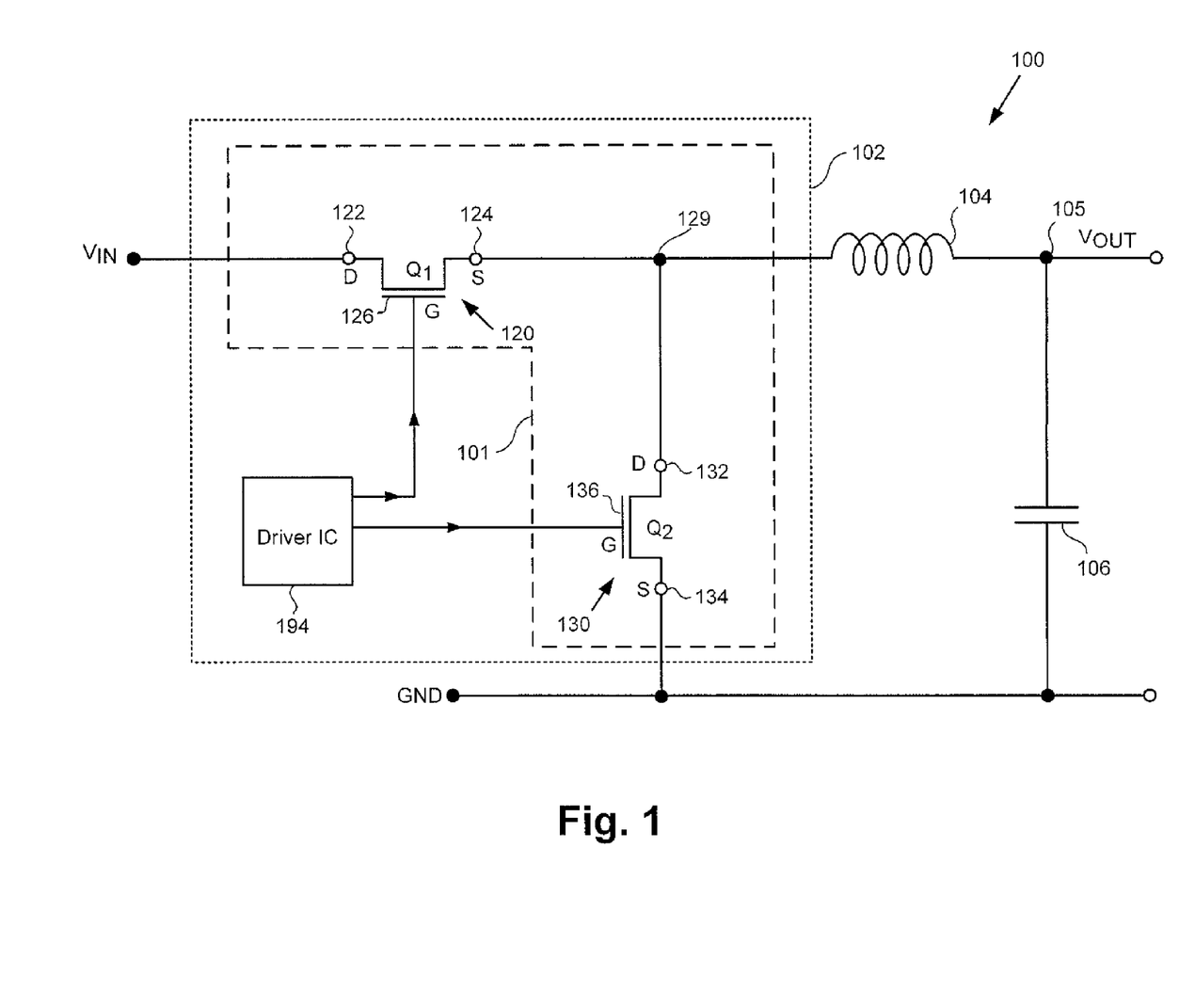
FIG. 1 shows a diagram of an exemplary power converter circuit.

FIG. 1 shows a diagram of an exemplary power converter circuit. Power converter 100 includes power converter multichip module (MCM) 102, output inductor 104, and output capacitor 106. As shown in FIG. 1, MCM 102 includes switching stage 101 of power converter 100, and driver IC 194 implemented to provide drive signals to switching stage 101. As shown in FIG. 1, power converter 100 is configured to receive an input voltage $V_{IN}$, and to provide a converted voltage, e.g., a rectified and/or stepped down voltage, as $V_{OUT}$ at output 105.

Switching stage 101 may be implemented using two power switches in the form of metal-oxide-semiconductor field-effect transistors (MOSFETs) configured as a half bridge, for example. That is to say, switching stage 101 may include high side or control switch 120 ($Q_1$) having drain 122, source 124, and gate 126, as well as low side or synchronous (sync) switch 130 ($Q_2$) having drain 132, source 134, and gate 136. Control switch 120 is coupled with sync switch 130 at switch node 129, which, in turn, is coupled to output 105 through output inductor 104. Respective control and sync switches 120 and 130 may be implemented as group IV based power devices, such as silicon power MOSFETs having a vertical design, for example. Power converter 100 may be advantageously utilized as a voltage converter, for example a buck converter, in a variety of automotive, industrial, appliance, and lighting applications.

It is noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV material based, or group III-V semiconductor based, power transistors. It is noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

The connection between control switch 120 and sync switch 130 providing switch node 129 can be implemented using a conductive clip, such as a copper clip, which must be sufficiently robust to accommodate high current. Moreover, because control switch 120 and sync switch 130 can be highly sensitive to electrical resistance, the cross-sectional area of the conductive clip used to provide switch node 129 is often relatively large. In addition, control and sync switches 120 and 130 are capable of generating substantial heat during operation. As a result, packaging solutions providing thermal protection to control and sync switches 120 and 130 may include a heat spreader, which is often also relatively large. Consequently, a packaging solutions for MCM 102 must typically be sized to accommodate not only driver IC 194 and control and sync switches 120 and 130, but a large heat spreader providing thermal protection for the power switches and a large conductive clip for their connection as well.

Figure 2:
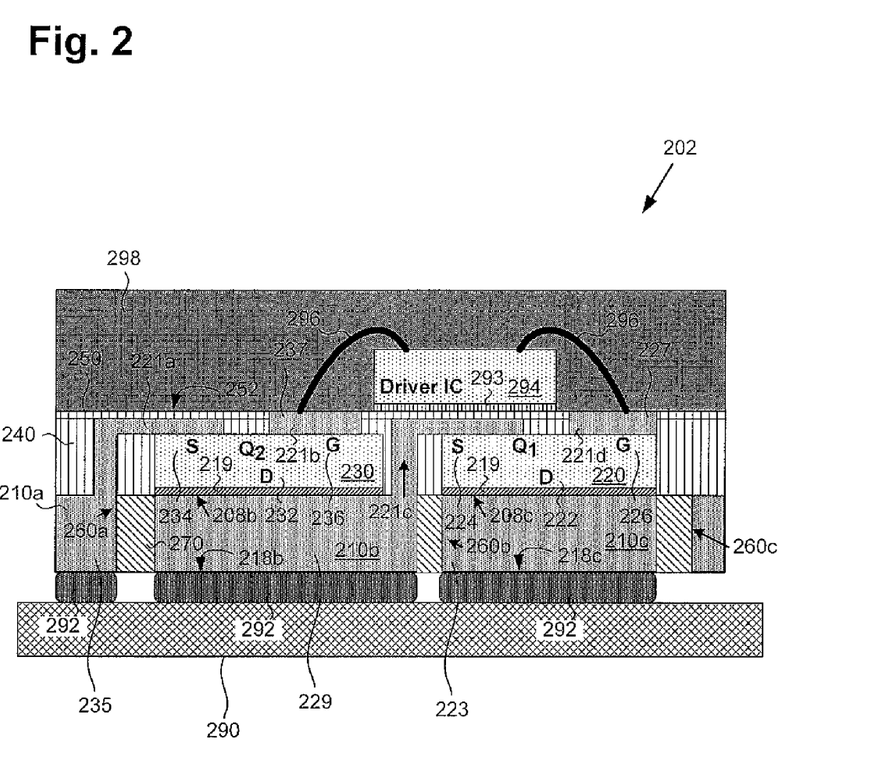
FIG. 2 shows a cross-sectional view of an exemplary semiconductor package suitable for use as a power converter package and including a vertically stacked driver integrated circuit (IC).

The present application discloses a packaging solution enabling omission of the aforementioned heat spreader and switch node conductive clip, while concurrently providing a highly compact design for packaging driver IC 194 and switching stage 101 together. In one implementation, a control conductive carrier and a sync conductive carrier utilized, respectively, as structural supports for control switch 120 and sync switch 130, are configured to provide integrated heat spreading. In addition, the support structure used to provide the control conductive carrier and the sync conductive carrier can also be used to provide switch node 129, as well as to electrically couple driver IC 194 to one or both of control switch 120 and sync switch 130. FIG. 2 shows an exemplary representation of such a packaging solution.

FIG. 2 shows a cross-sectional view of semiconductor package 202 attached to mounting surface 290, which may be a printed circuit board (PCB) for example, by solder bodies 292. Semiconductor package 202 includes control conductive carrier 210c having die side 208c and opposite input/output (I/O) side 218c connecting semiconductor package 202 to mounting surface 290. Semiconductor package 202 also includes sync conductive carrier 210b having die side 208b and opposite I/O side 218b also connecting semiconductor package 202 to mounting surface 290.

Semiconductor package 202 further includes control FET 220 ($Q_1$) having drain 222, source 224, and gate 226, as well as sync FET 230 ($Q_2$) having drain 232, source 234, and gate 236. As shown in FIG. 2, control FET 220 is attached to die side 208c of control conductive carrier 210c, and sync FET 230 is attached to die side 208b of sync conductive carrier 210b. Semiconductor package 202 also includes conductive carrier section 210a, and conductive buildup layers 221a, 221b, 221c, and 221d (hereinafter "conductive buildup layers 221a-221d"). In addition, semiconductor package 202 includes electrically conductive die attach material 219, first patterned dielectric 240, insulator 270 filling isolation trenches 260a, 260b, and 260c (hereinafter "isolation trenches 260a-260c"), and second patterned dielectric 250 providing surface 252.

Also included as part of semiconductor package 202 are control drain contact 223 provided by control conductive carrier 210c, sync source contact 235 provided by conductive carrier section 210a, respective control and sync gate contacts 227 and 237 including respective conductive buildup layers 221d and 221b, and switch node contact 229 provided by sync conductive carrier 210b. It is noted that, in addition to providing sync source contact 235, switch node contact 229, and control drain contact 223, respective conductive carrier section 210a, sync conductive carrier 210b, and control conductive carrier 210c provide integrated heat spreading functionality for sinking heat generated in semiconductor package 202 away from control and sync FETs 220 and 230 and into mounting surface 290.

As shown in FIG. 2, another advantage of providing integrated heat spreading using conductive carrier section 210a, sync conductive carrier 210, and control conductive carrier 210c is the vertical space available for driver IC 294 due to omission of a separate heat spreader for control and sync FETs 220 and 230. For example, and as further shown in FIG. 2, in one implementation, driver IC 294 may be situated above one or both of control and sync FETs 220 and 230. As shown in FIG. 2, driver IC 294 may be attached to at surface 252 of semiconductor package 202 using die attach material 293. Also shown in FIG. 2 is encapsulation material 298 covering driver IC 294.

Driver IC 294 can be electrically coupled to one or both of respective control and sync gate contacts 227 and 237 of respective control and sync FETs 220 and 230. Thus, driver IC 294 may be electrically coupled to gate 226 of control FET 220 by control gate contact 227 through conductive buildup layer or layers 221d formed over control conductive carrier 210c. In addition, or in the alternative, driver IC 294 may be electrically coupled to gate 236 of sync FET 230 by sync gate contact 237 through conductive buildup layer or layers 221b formed over sync conductive carrier 210b. Moreover, as shown in FIG. 2, in one implementation, driver IC 294 can be electrically coupled to one or both of control and sync gate contacts 227 and 237 including respective conductive buildup layers 210d and 210b by bondwires 296.

Semiconductor package 202 corresponds in general to MCM 102 in FIG. 1. In addition, control FET 220 having drain 222, source 224, and gate 226, and sync FET 230 having drain 232, source 234, and gate 236, correspond in general to control switch 120 having drain 122, source 124, and gate 126, and sync switch 130 having drain 132, source 134, and gate 136, respectively, in FIG. 1. Moreover, switch node contact 229, in FIG. 2, corresponds to switch node 129, in FIG. 1.

The features of semiconductor package 202 will be described in greater detail by reference to FIG. 3, and FIGS. 4A, 4B, 4C, 4D, 4E, 4F, 4G, and 4H (hereinafter "FIGS. 4A-4H"). However, it is noted in reference to FIG. 2 that the electrical connection between source 224 of control FET 220 and drain 232 of sync FET 230 is established in the absence of a conductive clip or other feature implemented solely or primarily as an electrical connector. Instead, according to the implementation shown in FIG. 2, the electrical connection between source 224 and drain 232 establishing switch node contact 229 is advantageously provided by sync conductive carrier 210b and conductive buildup layer or layers 221c. As a result, the packaging solution of FIG. 2 provides a robust, low resistance, and low parasitic connection for providing switch node contact 229. Moreover, the inventive concepts disclosed by the packaging solution represented in FIG. 2 can be extended to enable the fabrication of high density MCM packages, with reduced parasitics and improved thermal performance.

Figure 3:
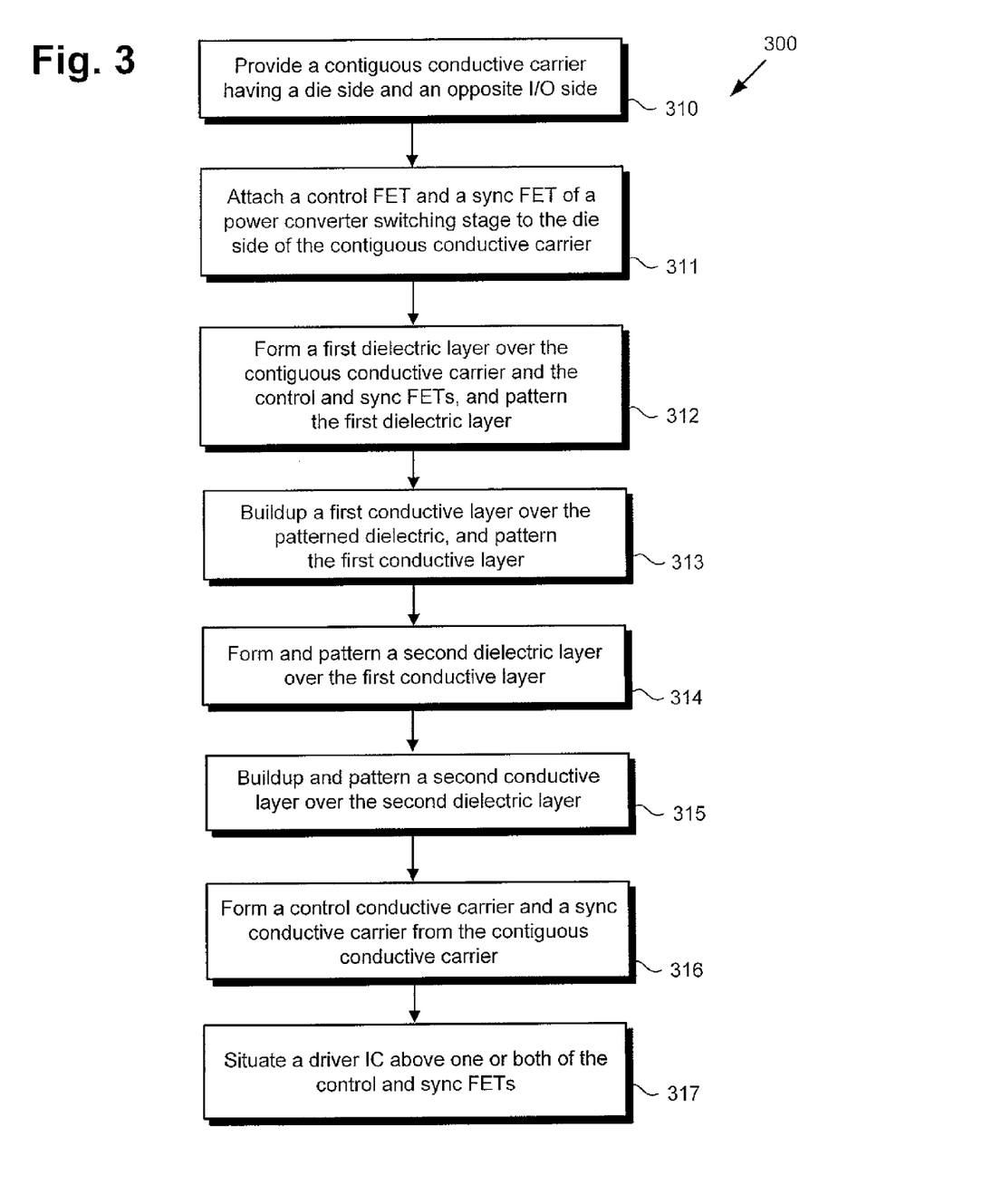
FIG. 3 shows a flowchart presenting one exemplary method for fabricating a semiconductor package suitable for use as a power converter package and including a vertically stacked driver IC.

Referring to FIG. 3, FIG. 3 shows flowchart 300 presenting an exemplary method for fabricating a semiconductor package suitable for use as a power converter package and including a vertically stacked driver IC. It is noted that the method described by flowchart 300 is performed on a portion of a conductive carrier structure, which may be a semiconductor package lead frame, or may take the form of a conductive sheet or plate, for example.

Figure 4A:
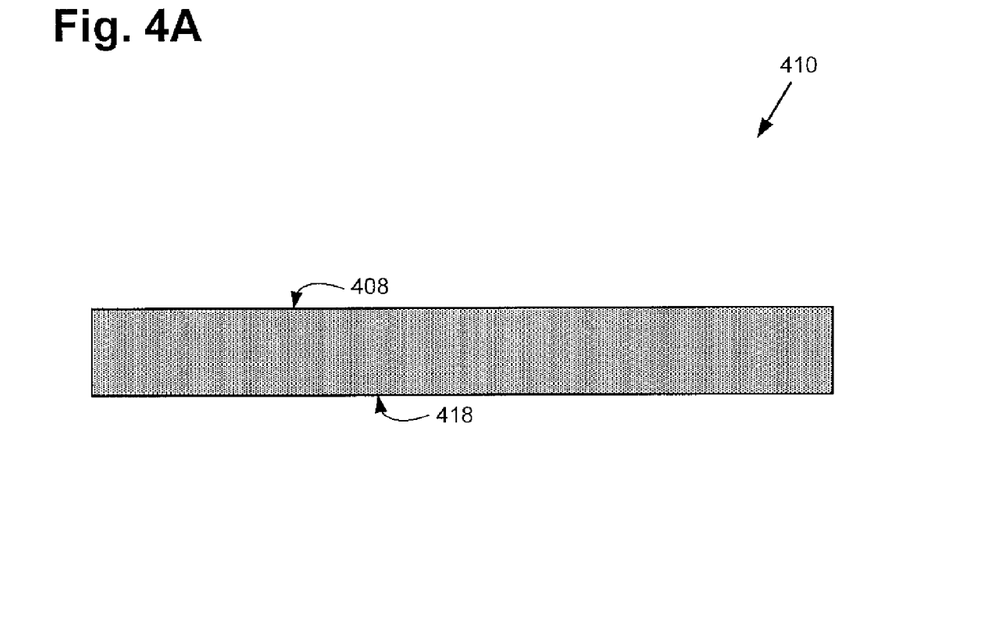
FIG. 4A shows an exemplary structure corresponding to an initial stage of the method described in FIG. 3.

With respect to FIGS. 4A-4H, structures 410 through 417 shown respectively in those figures illustrate the result of performing the method of flowchart 300. For example, FIG. 4A represents contiguous conductive carrier 410 before processing (310), structure 411 shows contiguous conductive carrier 410 after attachment by a control FET and a sync FET (311), structure 412 shows structure 411 after the formation and patterning of a dielectric layer (312), and so forth. It is noted that contiguous conductive carrier 410, in FIGS. 4A through 4F, corresponds in general to, and serves as a foundational structure for, control conductive carrier 210c, sync conductive carrier 210b, and conductive carrier section 210a, in FIG. 2. It is further noted that although FIGS. 4A-4H depict formation of structures including two dielectric layers and two conductive buildup layers, other implementations using the present concepts may include more, or less, than two dielectric layers and two conductive buildup layers.

Referring to flowchart 300, in FIG. 3, in combination with FIG. 4A, flowchart 300 begins with providing contiguous conductive carrier 410 having die side 408 and opposite I/O side 418 (310). As shown in FIG. 4A, contiguous conductive carrier 410 is represented as an unpatterned conductive sheet or plate. Contiguous conductive carrier 410 may be formed of any conductive material having a suitably low electrical resistance. Examples of materials from which contiguous conductive carrier 410 may be formed include copper (Cu), aluminum (Al), or a conductive alloy. In one implementation, contiguous conductive carrier 410 may be implemented using a semiconductor package lead frame. It is noted that die side 408 of contiguous conductive carrier 410 corresponds in general to die sides 208c and 208b of respective control and sync conductive carriers 210c and 210b, in FIG. 2. It is further noted that I/O side 418 of contiguous conductive carrier 410 corresponds in general to I/O sides 218c and 218b of respective control and sync conductive carriers 210c and 210b, in FIG. 2.

Although not shown in the present figures, in some implementations, contiguous conductive carrier 410 may include a barrier metal layer formed on one or both of die side 408 and I/O side 418. Such a barrier metal layer may be formed of nickel-gold (NiAu) or nickel-palladium-gold (NiPdAu), for example. In some implementations, such a barrier metal layer may serve as an etching mask during patterning or pre-patterning of contiguous conductive carrier 410. Thereafter, such a barrier metal layer can provide a solderable surface at one or both of die side 408 and I/O side 418 of contiguous conductive carrier 410.

Figure 4B:
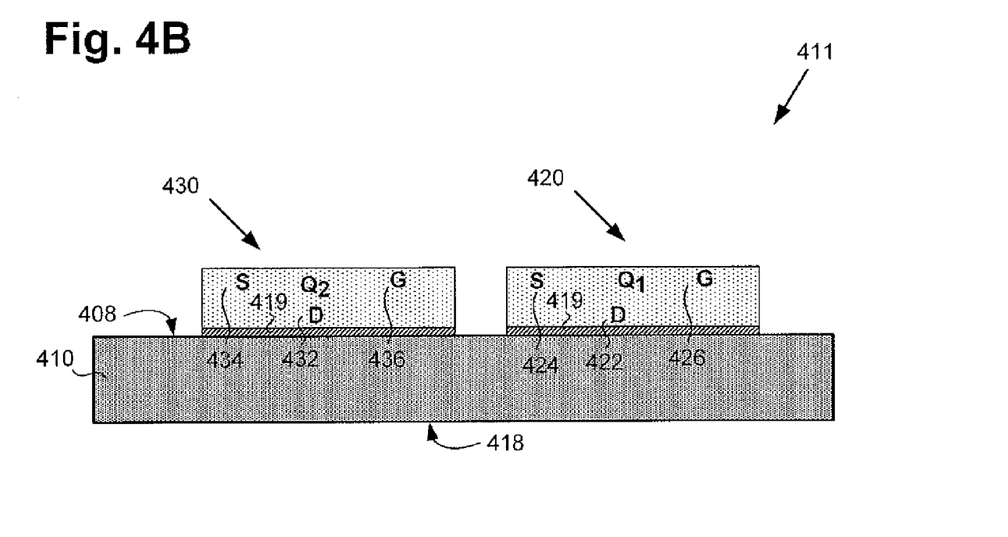
FIG. 4B shows the exemplary structure in FIG. 4A at an intermediate stage of the method described in FIG. 3.

Moving to structure 411 in FIG. 4B with ongoing reference to FIG. 3, flowchart 300 continues with attaching control FET 420 ($Q_1$) and sync FET 430 ($Q_2$) to die side 408 of contiguous conductive carrier 410 (311). Control FET 420 includes drain 422, source 424, and gate 426, while sync FET 430 includes drain 432, source 434, and gate 436. As shown in FIG. 4B, control FET 420 and sync FET 430 are attached to die side 408 of contiguous conductive carrier 410 by electrically conductive die attach material 419.

Electrically conductive die attach material 419 may be any suitable substance, such as a conductive epoxy, solder, a conductive sintered material, or diffusion bonded material formed to a thickness of from approximately 0.5 mm to approximately 2.0 mm, for example. Control FET 420 and sync FET 430 are shown as power FETs having a vertical topology. That is to say, source 424 and gate 426 are situated on the same side of control FET 420, while drain 422 is situated on an opposite side of control FET 420. Similarly, source 434 and gate 436 are situated on the same side of sync FET 430, while drain 432 is situated on an opposite side of sync FET 430.

In one implementation, respective control and sync FETs 420 and 430 may take the form of group IV material based vertical FETs, such as silicon vertical MOSFETs for example. However, in other implementations, respective control and sync FETs 420 and 430 may take the form of group III-V based power FETs, such as GaN or other III-Nitride based FETs. Control FET 420, sync FET 430, and electrically conductive die attach material 419 correspond respectively to control FET 220, sync FET 230, and electrically conductive die attach material 219, in FIG. 2. In other words, control FET 220 and sync FET 230 correspond respectively to control switch 120 and sync switch 130, in FIG. 1, and may be used to implement power converter switching stage 101 in that figure.

Figure 4C:
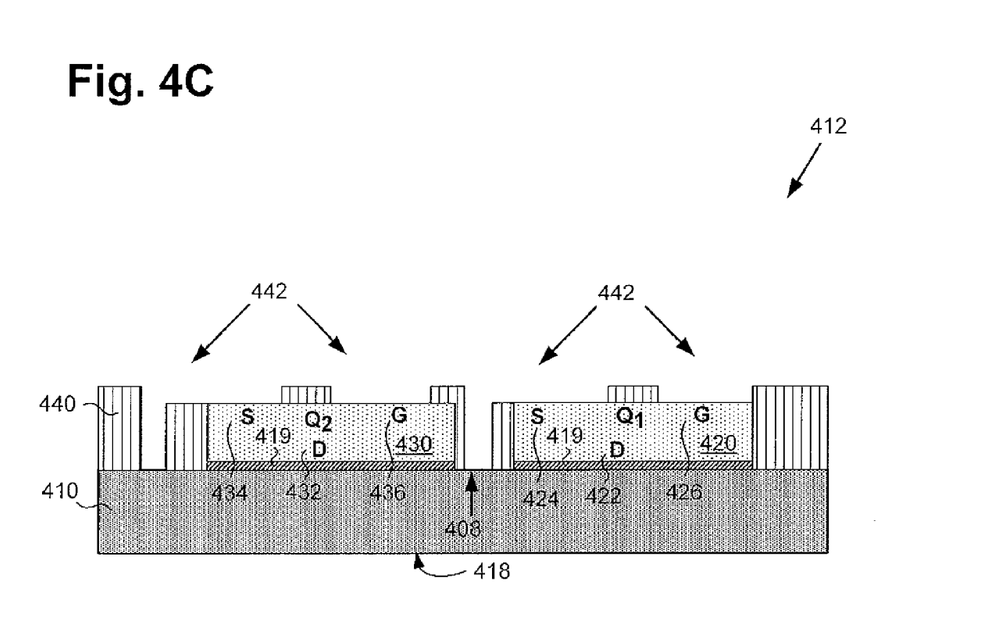
FIG. 4C shows the exemplary structure in FIG. 4B at another intermediate stage of the method described in FIG. 3.

As shown by structure 412 in FIG. 4C, flowchart 300 continues with forming a dielectric layer over contiguous conductive carrier 410, control FET 420, and sync FET 430, followed by patterning of the dielectric layer to form first patterned dielectric 440 (312). First patterned dielectric 440 may be formed by initially laminating a pre-formed dielectric layer onto contiguous conductive carrier 410, control FET 420, and sync FET 430, and then patterning the pre-formed dielectric layer to produce windows 442. Such a pre-formed dielectric layer may be cut or otherwise patterned from a pre-formable dielectric material, such as an epoxy-phenolic or cyanate ester-epoxy build-up material, for example, or any other pre-formable dielectric utilized in laminate substrate technology. In one implementation, for example, first patterned dielectric 440 may be formed of a B-stage polymeric material cured during lamination.

Patterning of the dielectric layer to form first patterned dielectric 440 including windows 442 can be performed using any known technique, such as etching. First patterned dielectric 442 includes windows 442 exposing die side 408 of contiguous conductive carrier 410 adjacent each of control FET 420 and sync FET 430, as well as exposing sources 424 and 434 and gates 426 and 436 of respective control and sync FETs 420 and 430. First patterned dielectric 440 corresponds to first patterned dielectric 240, in FIG. 2.

Figure 4D:
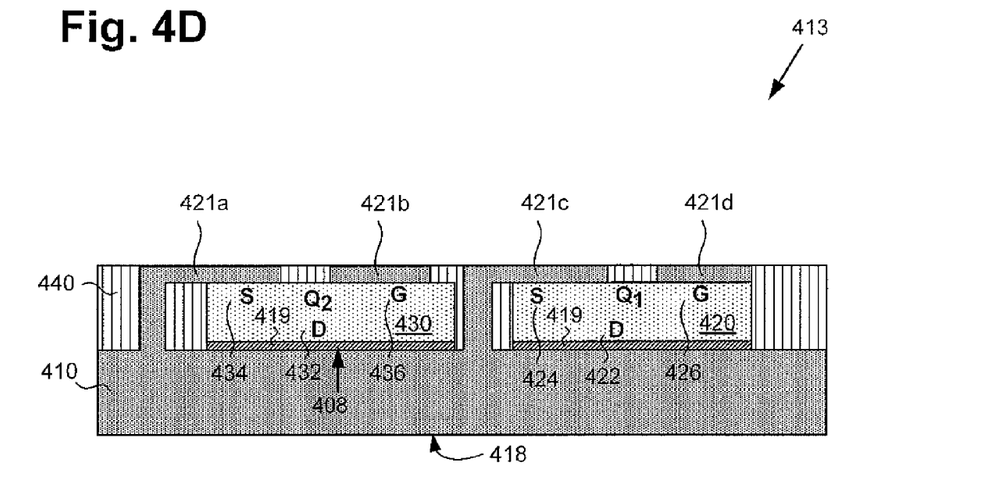
FIG. 4D shows the exemplary structure in FIG. 4C at another intermediate stage of the method described in FIG. 3.

Moving to structure 413 in FIG. 4D, flowchart 300 continues with buildup of a first conductive layer over first patterned dielectric 440, and patterning of the first conductive layer to form conductive buildup layers 421a, 421b, 421c, and 421d (hereinafter "conductive buildup layers 421a-421d") (313). Conductive buildup layers 421a-421d may be formed of Cu or Al, for example, or may be a metal alloy, such as a metal alloy including Cu and Ni, for example. Conductive buildup layers 421a-421d may be built up using any suitable technique, such as electrochemical deposition or an electrolytic plating process, for example. Conductive buildup layers 421a-421d correspond respectively to conductive buildup layers 221a-221d, in FIG. 2.

Figure 4E:
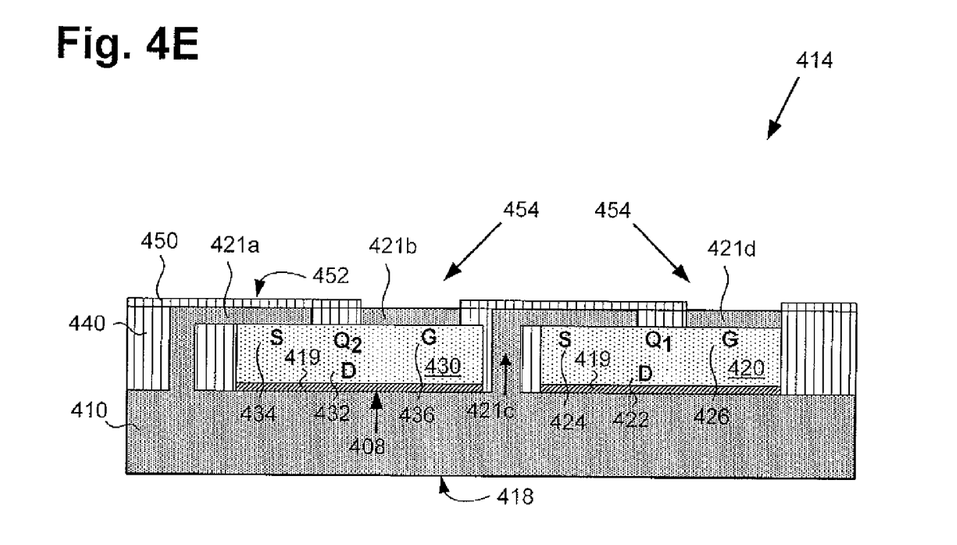
FIG. 4E shows the exemplary structure in FIG. 4D at another intermediate stage of the method described in FIG. 3.

Continuing to structure 414 in FIG. 4E, flowchart 300 continues with formation and patterning of a second dielectric layer over conductive buildup layers 421a-421d and first patterned dielectric 440 to produce second patterned dielectric 450 (314). Like first patterned dielectric 440, second patterned dielectric 450 may be formed by initially laminating a pre-formed dielectric layer, and then patterning the pre-formed dielectric layer to produce windows 454. As noted above, such a pre-formed dielectric layer may be cut or otherwise patterned from any pre-formable dielectric material utilized in laminate substrate technology. In one implementation, second patterned dielectric 450 may be formed of a B-stage polymeric material cured during lamination.

Patterning of the second dielectric layer to form second patterned dielectric 450 including windows 454 can be performed using any known technique, such as etching. Second patterned dielectric 450 provides surface 452 and corresponds to second patterned dielectric 250 providing surface 252, in FIG. 2.

Figure 4F:
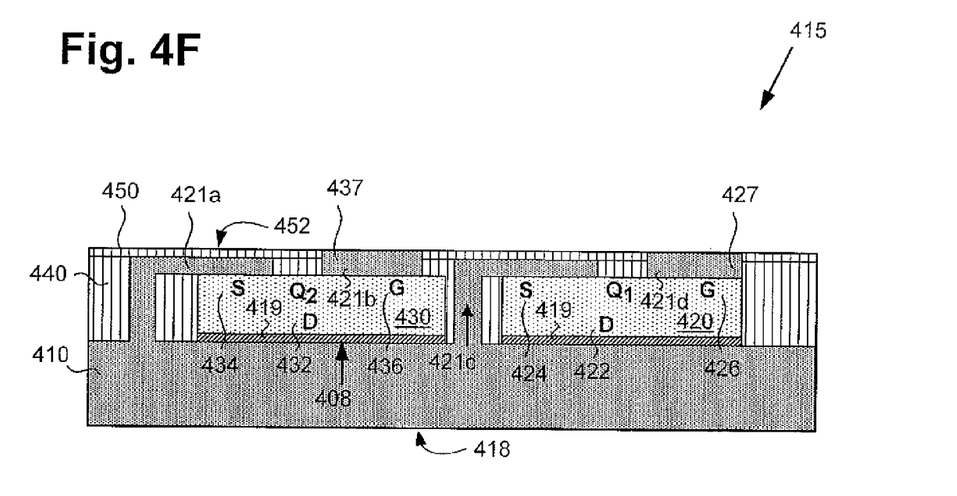
FIG. 4F shows the exemplary structure in FIG. 4E at another intermediate stage of the method described in FIG. 3.

Moving to structure 415 in FIG. 4F, flowchart 300 continues with buildup of a second conductive layer over second patterned dielectric 450, and patterning of the second conductive layer to form respective control and sync gate contacts 427 and 437 (315). The second conductive layer may be formed of Cu or Al, for example, or may be a metal alloy, such as a metal alloy including Cu and Ni, for example. The second conductive layer may be built up using any suitable technique, such as electrochemical deposition or an electrolytic plating process, for example. After buildup, the second conductive layer is patterned to form control gate contact 427 over conductive buildup layer 421d, and sync gate contact 437 over conductive buildup layer 421b. Respective control and sync gate contacts 427 and 437 correspond respectively to respective control and sync gate contacts 227 and 237, in FIG. 2.

Figure 4G:
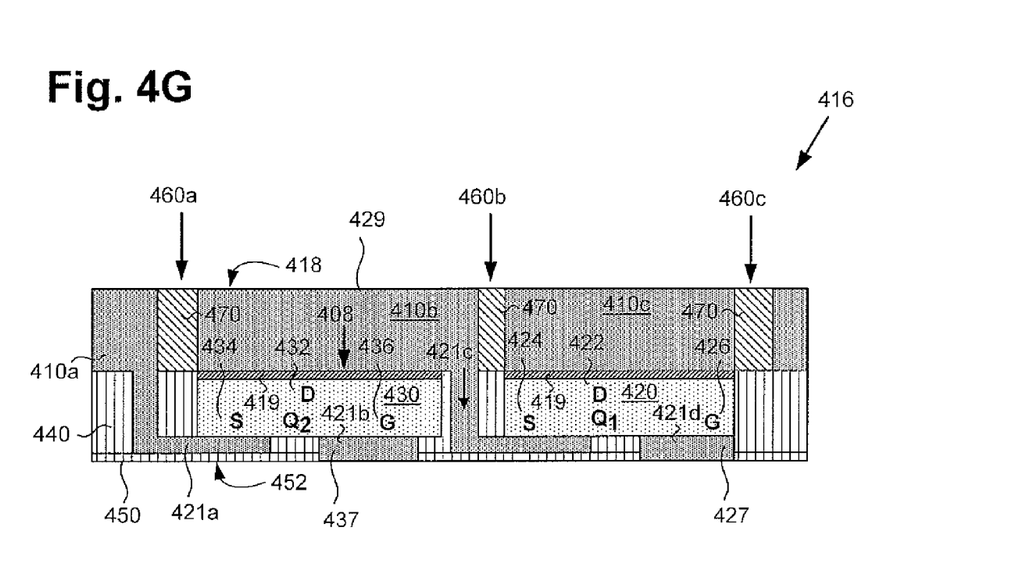
FIG. 4G shows the exemplary structure in FIG. 4F at another intermediate stage of the method described in FIG. 3.

Moving to structure 416 in FIG. 4G, flowchart 300 continues with formation of control conductive carrier 410c and sync conductive carrier 410b from contiguous conductive carrier 410 (316). As shown in FIG. 4G, control conductive carrier 410c and sync conductive carrier 410b may be produced by formation of isolation trenches 460a, 460b, and 460c (hereinafter "isolation trenches 460a-460c") through contiguous conductive carrier 410. As further shown in FIG. 4G, isolation trenches 460a-460c may be formed at I/O side 418 of contiguous conductive carrier 410 and extend from I/O side 418 to first patterned dielectric 440.

Isolation trenches 460a-460c may be formed using any suitable technique, such as etching, or laser ablation, for example, as known in the art. Formation of isolation trenches 460a-460c results in formation of control conductive carrier 410c, sync conductive carrier 410b, and conductive carrier section 410a from contiguous conductive carrier 410. Thus, in implementations in which contiguous conductive carrier 410 is a semiconductor package lead frame, control conductive carrier 410c, sync conductive carrier 410b, and conductive carrier section 410a, may each include a portion of such a lead frame. Isolation trenches 460a-460c, control conductive carrier 410c, sync conductive carrier 410b, and conductive carrier section 410a correspond respectively to isolation trenches 260a-260c control conductive carrier 210c, sync conductive carrier 210b, and conductive carrier section 210a, in FIG. 2.

It is noted that sync conductive carrier 410b including conductive buildup layer 421c electrically connects source 424 of control FET 420 to drain 432 of sync FET 430. In addition, according to the present exemplary implementation, sync conductive carrier 420b provides switch node contact 429. It is further noted, however, that the method of flowchart 300 can be readily adapted such that in other implementations control conductive carrier 420c may be used to provide switch node contact 429.

Although in some implementations, isolation trenches 460a-460c may provide sufficient electrical isolation to the features of structure 416 without a dielectric fill, the method of flowchart 300 may optionally continue with filling one or more of isolation trenches 460a-460c with insulator 470, as shown in FIG. 4G. Insulator 470 may be formed of solder resist, for example, and may be deposited or otherwise formed so as to fill one or more of isolation trenches 460a-460c. Insulator 470 corresponds to insulator 270 in FIG. 2.

Figure 4H:
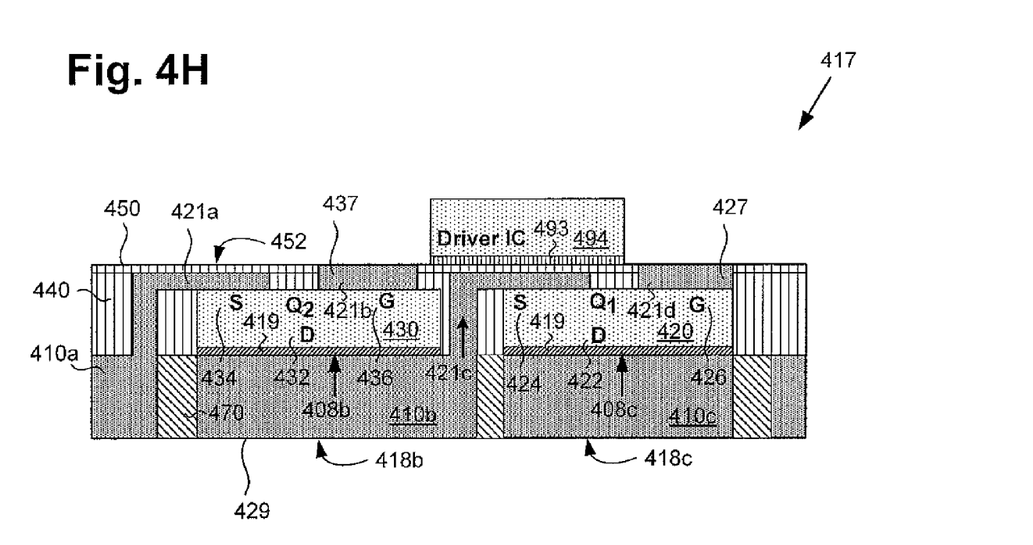
FIG. 4H shows the exemplary structure in FIG. 4G at another intermediate stage of the method described in FIG. 3.

Moving now to structure 417 in FIG. 4H, flowchart 300 continues with situating driver IC 494 above one or both of control FET 420 and sync FET 430 (317). As shown in FIG. 4H, in one implementation, driver IC 494 can be mounted face up over control conductive cattier 410c and sync conductive carrier 410b by being affixed to second patterned dielectric 450 at surface 452. Driver IC 494 can be affixed to surface 452 using die attach material 493, which may be a conductive or a nonconductive die attach material. Driver IC 494 and die attach material 493 correspond respectively to driver IC 294 and die attach material 293, in FIG. 2.

Structure 417 may undergo additional processing including attachment of bondwires corresponding to bondwires 296, in FIG. 2, for connecting driver IC 494 to control and sync FETS 420 and 430. In addition, an encapsulant corresponding to encapsulation material 298, in FIG. 2, may be applied so as to protect driver IC 494 and/or the bondwire connections between driver IC 494 and respective control and sync gate contacts 427 and 437. Thus, the implementations shown and described by reference to FIGS. 2, 3, and 4A-4H result in an MCM, such as MCM 202, in FIG. 2, configured to integrate switching stage 101 and driver IC 194 of FIG. 1 in a single semiconductor package by vertically stacking driver IC 194 over switching stage 101.

Figure 5:
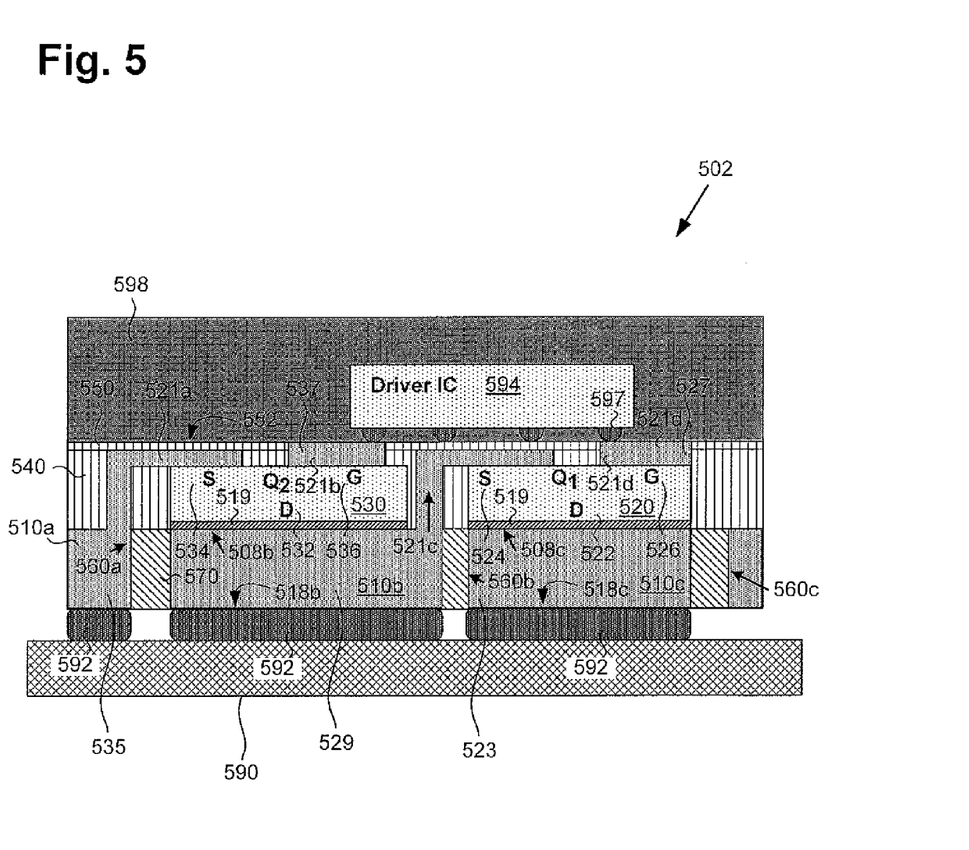
FIG. 5 shows a cross-sectional view of an exemplary semiconductor package suitable for use as a power converter package and including a vertically stacked driver IC, according to another implementation.

Referring now to FIG. 5, FIG. 5 shows a cross-sectional view of exemplary semiconductor package 502 including vertically stacked driver IC 594, according to another implementation. As shown in FIG. 5, semiconductor package 502 is attached to mounting surface 590, such as a PCB for example, by solder bodies 592. Semiconductor package 502 includes control conductive carrier 510c having die side 508c and opposite I/O side 518c connecting semiconductor package 502 to mounting surface 590. Semiconductor package 502 also includes sync conductive carrier 510b having die side 508b and opposite I/O side 518b also connecting semiconductor package 502 to mounting surface 590.

Semiconductor package 502 further includes control FET 520 ($Q_1$) having drain 522, source 524, and gate 526, as well as sync FET 530 ($Q_2$) having drain 532, source 534, and gate 536. As shown in FIG. 2, control FET 520 is attached to die side 508c of control conductive carrier 510c, and sync FET 530 is attached to die side 508b of sync conductive carrier 510b. Semiconductor package 502 also includes conductive carrier section 510a, and conductive buildup layers 521a, 521b, 521c, and 521d (hereinafter "conductive buildup layers 521a-521d"). In addition, semiconductor package 502 includes electrically conductive die attach material 519, first patterned dielectric 540, insulator 570 filling isolation trenches 560a, 560b, and 560c (hereinafter "isolation trenches 560a-560c"), and second patterned dielectric 550 providing surface 552. Also included as part of semiconductor package 502 are control drain contact 523 provided by control conductive carrier 510c, sync source contact 535 provided by conductive carrier section 510a, respective control and sync gate contacts 527 and 537 including respective conductive buildup layers 521d and 521b, and switch node contact 529 provided by sync conductive carrier 510b.

Control conductive carrier 510c, control FET 520, sync conductive carrier 510b, sync FET 530, conductive carrier section 510a, and electrically conductive die attach material 519 correspond respectively to control conductive carrier 210c, control FET 220, sync conductive carrier 210b, sync FET 230, conductive carrier section 210a, and electrically conductive die attach material 219, in FIG. 2. In addition, first patterned dielectric 540, isolation trenches 560a-560c, insulator 570, contacts 523, 529, and 535, and second patterned dielectric 550, in FIG. 5, correspond respectively to first patterned dielectric 240, isolation trenches 260a-260c, insulator 270, contacts 223, 229, and 235, and second patterned dielectric 250, in FIG. 2. Moreover, conductive buildup layers 521a-521d, and respective control and sync gate contacts 527 and 537, in FIG. 5, correspond respectively to conductive buildup layers 221a-221d, and respective control and sync gate contacts 227 and 237, in FIG. 2.

In contrast to the implementation shown in FIG. 2, however, the present implementation includes driver IC 594 flip chip mounted above at least one of conductive buildup layers 521d and 521b formed over respective control conductive carrier 520c and sync conductive carrier 510b. As shown in FIG. 5, driver IC 594 is flip chip mounted using solder bumps 597. As further shown in FIG. 5, driver IC 594 is covered by encapsulation material 598, corresponding to encapsulation material 298, in FIG. 2. It is noted that semiconductor package 502 including control FET 520, sync FET 530, and driver IC 594, in FIG. 5, corresponds in general to MCM 102 including control switch 120, sync switch 130, and driver IC 194, in FIG. 1.

According to the implementation shown in FIG. 5, sync conductive carrier 510b advantageously provides switch node contact 529 and thereby establishes the electrical connection between source 524 of control FET 520 and drain 532 of sync FET 530. Moreover, in addition to providing sync source contact 535, switch node contact 529, and control drain contact 523, respective conductive carrier section 510a, sync conductive carrier 510b, and control conductive carrier 510c provide integrated heat spreading for dissipation of heat generated in MCM 502 away from control and sync FETs dies 520 and 530 into mounting surface 590.

Thus, by configuring a conductive carrier utilized as a structural support for a power switch to include one or more conductive buildup layers enabling vertical stacking of the power switch and its driver IC, the packaging solutions disclosed herein advantageously achieve a highly compact package design. In addition, use of the conductive carrier to provide integrated heat spreading concurrently provides thermal protection for the power switch. Moreover, use of such a conductive carrier to couple a control switch to a sync switch so as to provide a switch node of a power converter switching stage enables further reductions in package size through omission of a conductive clip or any other feature implemented solely or primarily as a switch node electrical connector from a semiconductor package.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method for fabricating a semiconductor package, said method comprising:
   providing a contiguous conductive carrier having a die side and an opposite input/output (I/O) side;
   attaching a control FET and a sync FET of a power converter switching stage to said die side of said contiguous conductive carrier;
   forming a control conductive carrier attached to said control FET and a sync conductive carrier attached to said sync FET
   situating a driver integrated circuit (IC) for driving said control FET and said sync FET above at least one of said control FET and said sync FET;
   electrically coupling said driver IC to said control FET and said sync FET using conductive buildup layers formed over said control conductive carrier and said sync conductive carrier.

2. The method claim 1, wherein said driver IC is electrically coupled to said conductive buildup layers formed over said control conductive carrier and said sync conductive carrier by bondwire.

3. The method claim 1, wherein said driver IC is flip chip mounted above said conductive buildup layers formed over said control conductive carrier and said sync conductive carrier.

4. The method claim 1, wherein said control FET and said sync FET comprise silicon FETs.

5. The method claim 1, wherein said control FET and said sync FET comprise III-Nitride FETs.

6. The method claim 1, wherein said power converter switching stage is implemented as part of a buck converter.

7. A method for fabricating a semiconductor package, said method comprising:
   providing a carrier having a die side and an opposite input/output (I/O) side;
   attaching a control FET and a sync FET to said die side of said carrier;
   forming a control carrier attached to said control FET and a sync carrier attached to said sync FET;
   situating a driver integrated circuit (IC) for driving said control FET and said sync FET above at least one of said control FET and said sync FET;
   electrically coupling said driver IC to said control FET and said sync FET using conductive buildup layers formed over said control carrier and said sync carrier.

8. The method claim 7, wherein said driver IC is electrically coupled to said conductive buildup layers formed over said control carrier and said sync carrier by bondwire.

9. The method claim 7, wherein said driver IC is flip chip mounted above said conductive buildup layers formed over said control carrier and said sync carrier.

10. The method claim 7, wherein said control FET and said sync FET comprise silicon FETs.

11. The method claim 7, wherein said control FET and said sync FET comprise III-Nitride FETs.

* * * * *